(12) United States Patent
Ren et al.

(10) Patent No.: US 7,855,364 B2
(45) Date of Patent: Dec. 21, 2010

(54) PROJECTION ELECTRONIC MICROSCOPE FOR REDUCING GEOMETRIC ABERRATION AND SPACE CHARGE EFFECT

(75) Inventors: Weiming Ren, Tokyo (JP); Takeshi Murakami, Tokyo (JP)

(73) Assignee: Ebara Corporation, Tokyo (JP)

( * ) Notice: Subject to any disclaimer, the term of this patent is extended or adjusted under 35 U.S.C. 154(b) by 250 days.

(21) Appl. No.: 11/944,503

(22) Filed: Nov. 23, 2007

(65) Prior Publication Data
US 2008/0121820 A1    May 29, 2008

(30) Foreign Application Priority Data
Nov. 24, 2006    (JP)    ............................ 2006-317140

(51) Int. Cl.
*G01N 23/00*    (2006.01)
(52) U.S. Cl. ................. 250/311; 250/306; 250/307; 250/310
(58) Field of Classification Search ................ 250/310, 250/306, 307, 311, 396 R, 396 ML
See application file for complete search history.

(56) References Cited

U.S. PATENT DOCUMENTS 4,551,599 A * 11/1985 Liebl ..................... 250/396 R
6,608,308 B1 * 8/2003 Takagi et al. ................. 250/311
6,661,008 B2 * 12/2003 Takagi et al. ................... 850/9
6,683,320 B2 * 1/2004 Gerlach et al. ........... 250/494.1

FOREIGN PATENT DOCUMENTS

| JP | 11-224635 A | 8/1999 |
|---|---|---|
| JP | 2000-340152 A | 12/2000 |
| JP | 2006-32123 A | 2/2006 |

* cited by examiner

*Primary Examiner*—Jack I Berman
*Assistant Examiner*—Michael Maskell
(74) *Attorney, Agent, or Firm*—Westerman, Hattori, Daniels & Adrian, LLP

(57) ABSTRACT

A projection electronic microscope is provided for improving geometric aberration and a space charge effect within a zooming range using a zoom type transfer lens system in a projection/image formation optical system. The projection electronic microscope comprises an irradiation system for emitting a primary electron beam irradiated to a sample, and a projection/image formation optical system for guiding a second electron beams emitted from the sample with the irradiation of the primary electron beam to a detection system. The projection/image formation optical system includes a zoom type transfer lens system having a first zoom lens and a second zoom lens. The first zoom lens includes a plurality of electrodes. A predetermined electrode of said plurality of electrodes is made thicker and is applied with a positive voltage to form a space having zero field strength and a high positive potential between said first zoom lens and said second zoom lens, and a cross-over by said first zoom lens is defined in said space within a zooming range.

4 Claims, 6 Drawing Sheets

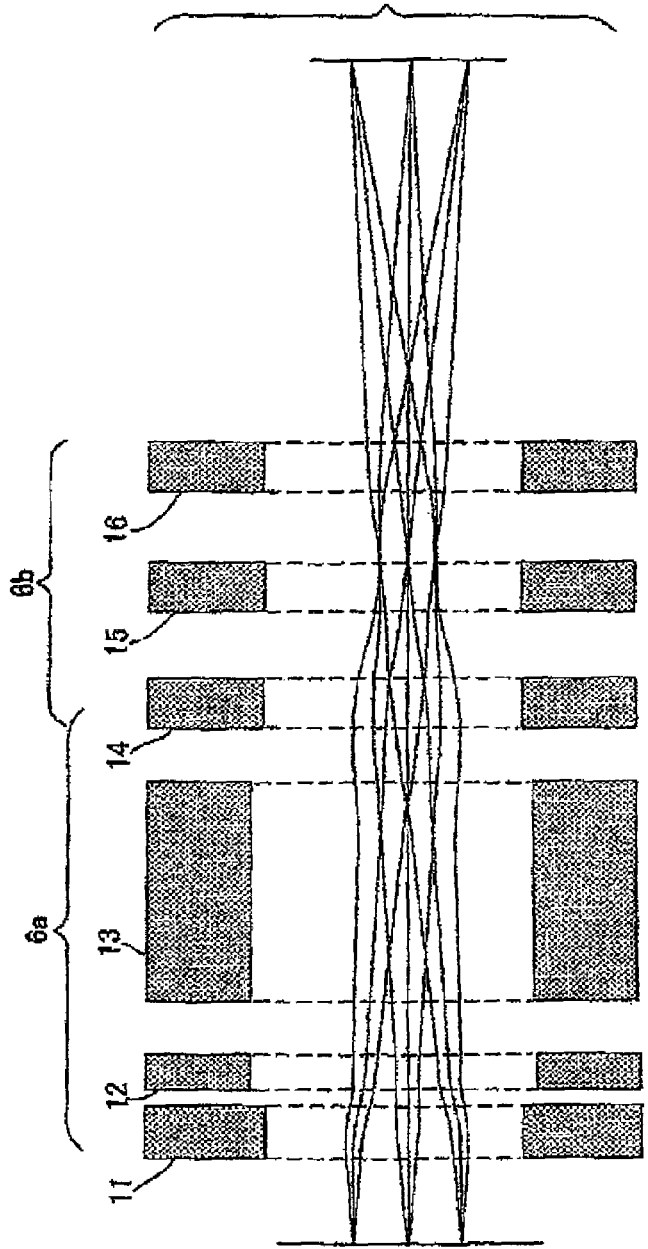
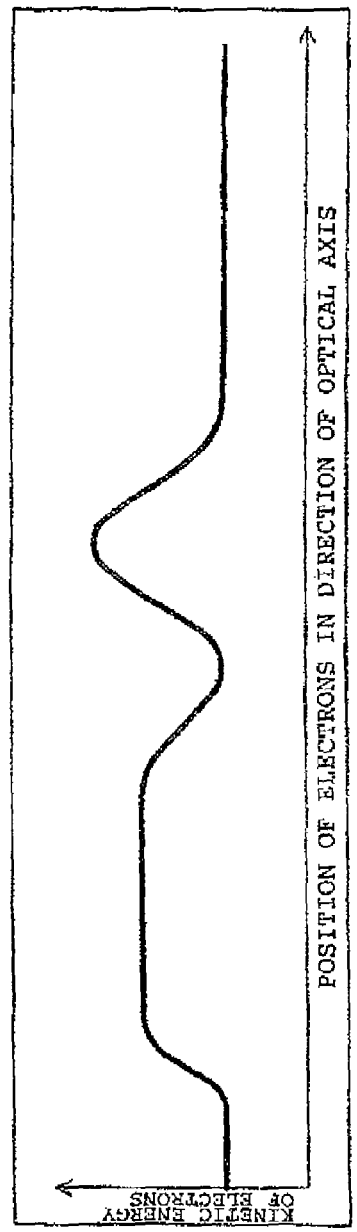
FIG.6A
FIG.6B

PROJECTION ELECTRONIC MICROSCOPE FOR REDUCING GEOMETRIC ABERRATION AND SPACE CHARGE EFFECT

BACKGROUND OF THE INVENTION

1. Field of the Invention

The present invention relates to a projection electronic microscope for irradiating a surface of a sample with electron beams to make observation, testing and the like of the surface of the sample using resulting secondary electrons, reflected electrons and the like, and more particularly, to a projection electronic microscope for reducing geometric aberration and space charge effect.

2. Description of the Related Art

A projection electronic microscope irradiates a wide area on a surface of a sample with electron beams emitted from an irradiation electro-optical system (primary electro-optical system), collectively focuses secondary electrons and reflected electrons emitted from the surface of the sample on a detection plane of a detection system using an image formation electro-optical system (secondary electro-optical system) for two-dimensionally observing the surface of the sample. Such a projection electronic microscope draws attention for use as an apparatus for testing micro-devices such as semiconductors, because of its abilities to observe a wider area on a surface of a sample with a smaller number of scans than a conventional SEM, and therefore reduce a sample observation time (see JP-2004-209429A).

FIG. 1 illustrates an exemplary configuration of a conventional projection electronic microscope. The projection electronic microscope 20 comprises an electron gun 21 for emitting a primary electron beam for irradiating a sample W therewith; an illumination optical system 22 for reshaping the primary electron beam and guiding the reshaped primary electron beam to the sample W; a beam separator 23 for changing a direction in which the primary electron beam travels to be perpendicular to the sample W, and separating a secondary electron beam such as secondary electrons, reflected electrons and the like emitted from the sample with the irradiation of the primary electron beam from the primary electron beam; a projection/image formation optical system 24 for reshaping the secondary electron beam; and a detection system 25 for two-dimensionally detecting the secondary electron beam. The projection/image formation optical system 24 for guiding the secondary electron beam to the detection system 25 comprises an objective lens system 24a, a transfer lens system 24b, and projection lens system 24c which are arranged along a linear optical axis 26 of the secondary electron beam.

Describing the operation of the projection electronic microscope illustrated in FIG. 5 in brief, the electron beam 21 generates a primary electron beam. The generated primary electron beam is incident on the illumination optical system 22, and is reshaped by the illumination optical system 22 into a beam which fits in a required irradiation range. The reshaped primary electron beam is incident on the beam separator 23 which deflects the motion direction of the primary electron beam in a direction perpendicular to the surface of the sample W. Next, the primary electron beam is incident on the objective lens system 24a of the projection/image formation optical system 24, is reshaped by the objective lens 24a into an electron beam which has a uniform irradiation intensity on the surface of the sample W, and is irradiated perpendicularly to the surface of the sample W.

From the surface of the sample W irradiated with the primary electron beam, a secondary electron beam is emitted in the direction perpendicular to the surface of the sample W. The secondary electron beam has a distribution in accordance with the shape, a material distribution, a change in potential, and the like of the surface. The objective leas system 24 converges the secondary electron beam to focus the same on a center plane of the beam separator 23. The focused secondary electron beam travels along the optical axis 26 without being deflected by the beam separator 23, and is focused in front of the projection lens 24c by the transfer lens system 24b. Further, the thus focused secondary electron beam is focused on a detection plane 9 of the detection system 25 by the projection lens system 24.

FIG. 2 illustrates an exemplary configuration of the projection/image formation optical system 24 in detail, where the transfer lens 24b is used as a zoom type projection/image formation optical system which additionally serves as a zoom system. In FIG. 2, the objective lens group 24a comprises a first objective lens 4a, a second objective lens 4b, and a diagram 5 disposed therebetween. The transfer lens system 24b comprises a first zoom lens 6a and a second zoom lens 6b. The projection lens system 24c comprises a first projection lens 8a and a second projection lens 8b.

In FIG. 2, secondary electron beams 3 are emitted from a sample surface 1 in a direction along the optical axis 26 with the irradiation of the primary electron beam. In FIG. 6, a peripheral electron beam 3a refers to a beam emitted from an axial point on the sample surface 1, and main electron beam 3b refers to a beam emitted from an off-axis point on the sample surface 1 among the emitted secondary electron beam 3. Motions of these electron beams will be described below in brief.

The peripheral electron beam 3a emitted from the sample surface 1 is collimated by the first projection lens 4a to be in parallel with the optical axis 26, passes through the diagram 5, is converged by the second objective lens 4b to focus on the center plane 7 of the beam separator 23, and is then converged by the first zoom lens 6a and second zoom lens 6b to focus near the center point of the first projection lens 8a. The thus focused peripheral electron beam 3a is converged by two projection lenses 8a, 8b of the projection lens system 24c to focus on the detection plane 9 of the detection system 25.

On the other hand, the main electron beam 3b is incident on the first objective lens 4a, and then produces a first cross-over C1 at the center of the diagram 5. The main electron beam 4b which has passed through the diagram 5 is collimated by the second objective lens 4b to be in parallel with the optical axis 26, is incident on the first zoom lens 6a, and produces a second cross-over C2 in front of the second zoom lens 6b. Subsequently, the main electron beam 3b is converged by the second zoom lens 6b and two projection lenses 8a, 8b, and forms a third cross-over C3 near the center point of the second projection lens 8b.

Incidentally, it is known that the resolution of a projection electronic microscope is mainly determined by geometric aberration of the projection/image formation optical system 24 and the space charge effect of the secondary electron beams. This is because the projection/image formation optical system 24 employs electrons which have low kinetic energy of several eV on the sample side and several KeV in a field free space between the lens systems. For example, in the zoom type projection/image formation optical system as illustrated in FIG. 2, the secondary electron beams 3 are focused three times in order to achieve a highly magnified image formation (image formation when the projection/image formation optical system is set at a high magnification). Accordingly, the secondary electron beams converge three times, i.e., produce three cross-overs C1-C3. Since the electron density is extremely high in regions in which such crossovers are produced, as compared with other regions, the space charge effect becomes larger. In other words, an increase in the number of cross-overs causes the space charge effect to significantly increase.

Also, in the zoom type projection/image formation optical system 24 as illustrated in FIG. 2, the size of an observation field varies in accordance with the magnification with respect to the same detection area. Therefore, when the transfer lens system 24b is required to provide a larger zoom range than an ordinary zoom range of one to three times, the viewing field is wider in a lowly magnified image formation (image formation when the projection/image formation optical system is set at a low magnification), as compared with a highly magnified image formation, with a larger angle over which the beams diverge, resulting in another problem of a significant deterioration of off-axis geometric aberration.

SUMMARY OF THE INVENTION

The present invention has been proposed to solve the problems mentioned above, and it is an object of the invention to provide a projection electronic microscope which is capable of improving geometric aberration of a lowly magnified image formation and the space charge effect in a zooming range, using a transfer lens system in a zoom type projection/image formation optical system.

To achieve the above object, according to a first aspect, the present invention provides a projection electronic microscope which comprises an irradiation system for emitting a primary electron beam irradiated to a sample, and a projection/image formation optical system for guiding a second electron beams emitted from the sample with the irradiation of the primary electron beam to a detection system, wherein the projection/image formation optical system includes a zoom type transfer lens system having a first zoom lens and a second zoom lens, and the first zoom lens includes a plurality of electrodes. A predetermined electrode of the plurality of electrodes is made thicker and is applied with a positive voltage to form a space having zero field strength and a high positive potential between the first zoom lens and the second zoom lens, and a cross-over by the first zoom lens is defined in the space within a zooming range.

As described above, a predetermined electrode of the plurality of electrodes is made thicker and is applied with a positive voltage to form a space having zero field strength and a high positive potential between the first zoom lens and the second zoom lens, and a cross-over by the first zoom lens is defined in the space within a zooming range, so that the kinetic energy of electrons is increased in a region near the second cross-over C2, allowing secondary electron beams to rapidly pass through the equi-potential distribution space 10, which has zero field strength and a high positive potential, while maintaining a high electron density, thus making it possible to reduce an electron interaction time and debilitate the space charge effect.

In a second aspect, the present invention provides a projection electronic microscope which comprises an irradiation system for emitting a primary electron beam irradiated to a sample, and a projection/image formation optical system for guiding a second electron beams emitted from the sample with the irradiation of the primary electron beam to a detection system, wherein the projection/image formation optical system includes a zoom type transfer lens system having a first zoom lens and a second zoom lens, and the first zoom lens includes a plurality of electrodes. A predetermined electrode of the plurality of electrodes is made thicker and is applied with a positive voltage to form a space having zero field strength and a high positive potential between the first zoom lens and the second zoom lens, and a cross-over of lowly magnified image formation by the first zoom lens is defined on a second main surface of the second zoom lens in accordance with a zooming range of the projection/image formation optical system.

As described above, since the cross-over of lowly magnified image formation by the first zoom lens is defined on the second main surface of the second zoom lens when the projection/image formation optical system has a very large zooming range, for example, one to five times, a main electron beam is incident at substantially zero height with a small slope, thus making it possible to largely reduce the geometric aberration.

In a third aspect, the present invention provides a projection electronic microscope which comprises an irradiation system for emitting a primary electron beam irradiated to a sample, and a projection/image formation optical system for guiding a second electron beams emitted from the sample with the irradiation of the primary electron beam to a detection system, wherein the projection/image formation optical system includes a zoom type transfer lens system having a first zoom lens and a second zoom lens, and the first zoom lens includes a plurality of electrodes. A predetermined electrode of the plurality of electrodes is made thicker and is applied with a positive voltage to form a space having zero field strength and a high positive potential between the first zoom lens and the second zoom lens, and a cross-over of lowly magnified image formation by the first zoom lens is defined on a second main surface of the second zoom lens in accordance with a zooming range of the projection/image formation optical system, and a positive voltage is applied to a predetermined electrode of the second zoom lens.

As descried above, when the projection/image formation optical system has a very large zooming range, for example, one to five times, the cross-over of lowly magnified image formation by the first zoom lens is defined near the center point of a focusing electrode of the second zoom lens. Further, since a spatial potential near the focusing electrode is increased by applying a positive potential to the focusing electrode, electrons pass through this space at higher speeds, thus making it possible to reduce electron interaction time and debilitate the space charge effect.

In the projection electronic microscopes described above, the first zoom lens and second zoom lens may include einzel lenses.

BRIEF DESCRIPTION OF THE DRAWINGS

FIG. 6A is a diagram illustrating the configuration of electrodes in two zoom lenses of a transfer lens system shown in FIG. 5 and trajectories of electrons in a lowly magnified image formation; and FIG. 6B is a diagram showing a kinetic energy distribution of electrons in FIG. 6A.

DESCRIPTION OF THE PREFERRED EMBODIMENTS

Figure 1:
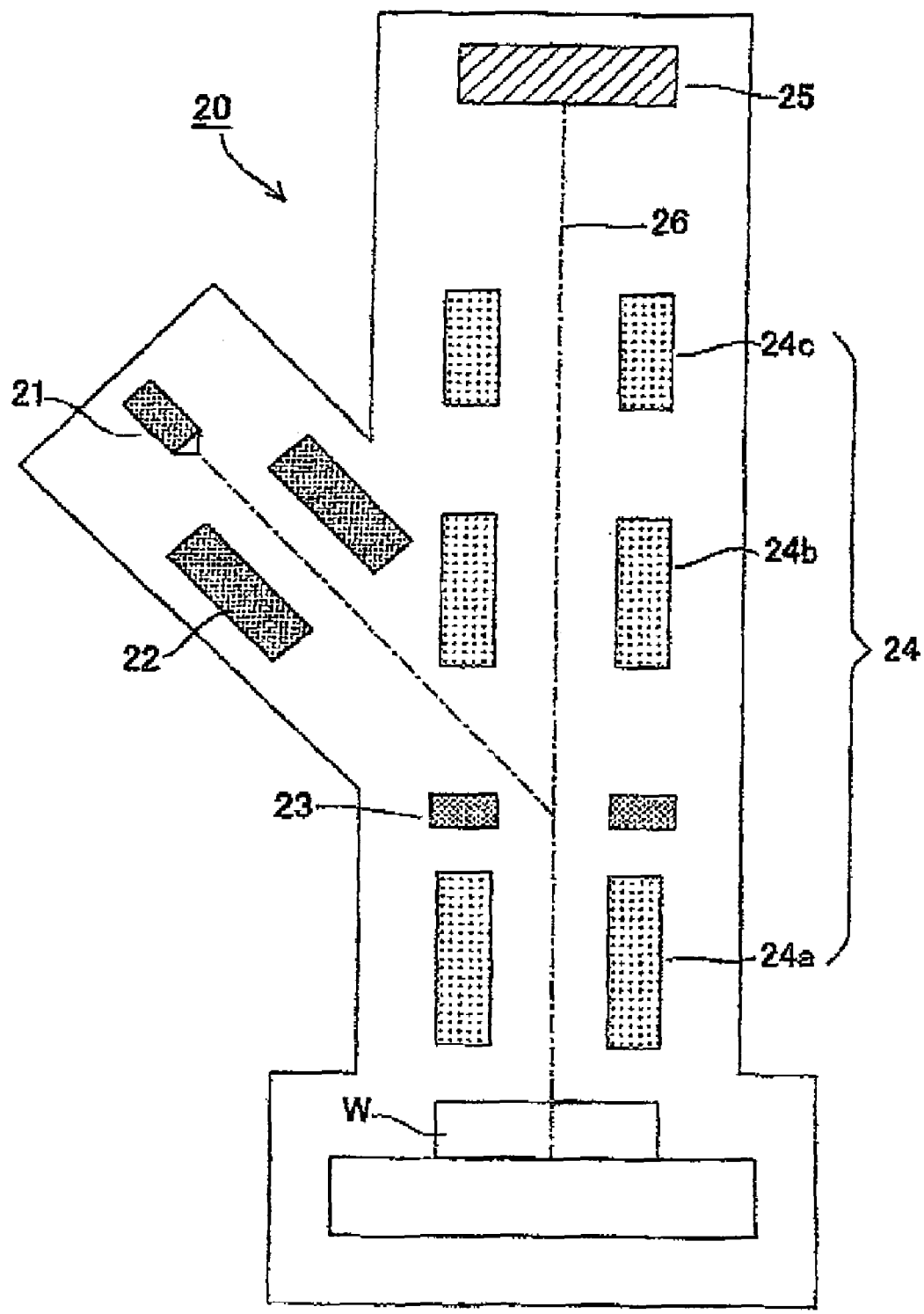
FIG. 1 is a diagram generally illustrating the configuration of a conventional projection electronic microscope.
Figure 2:
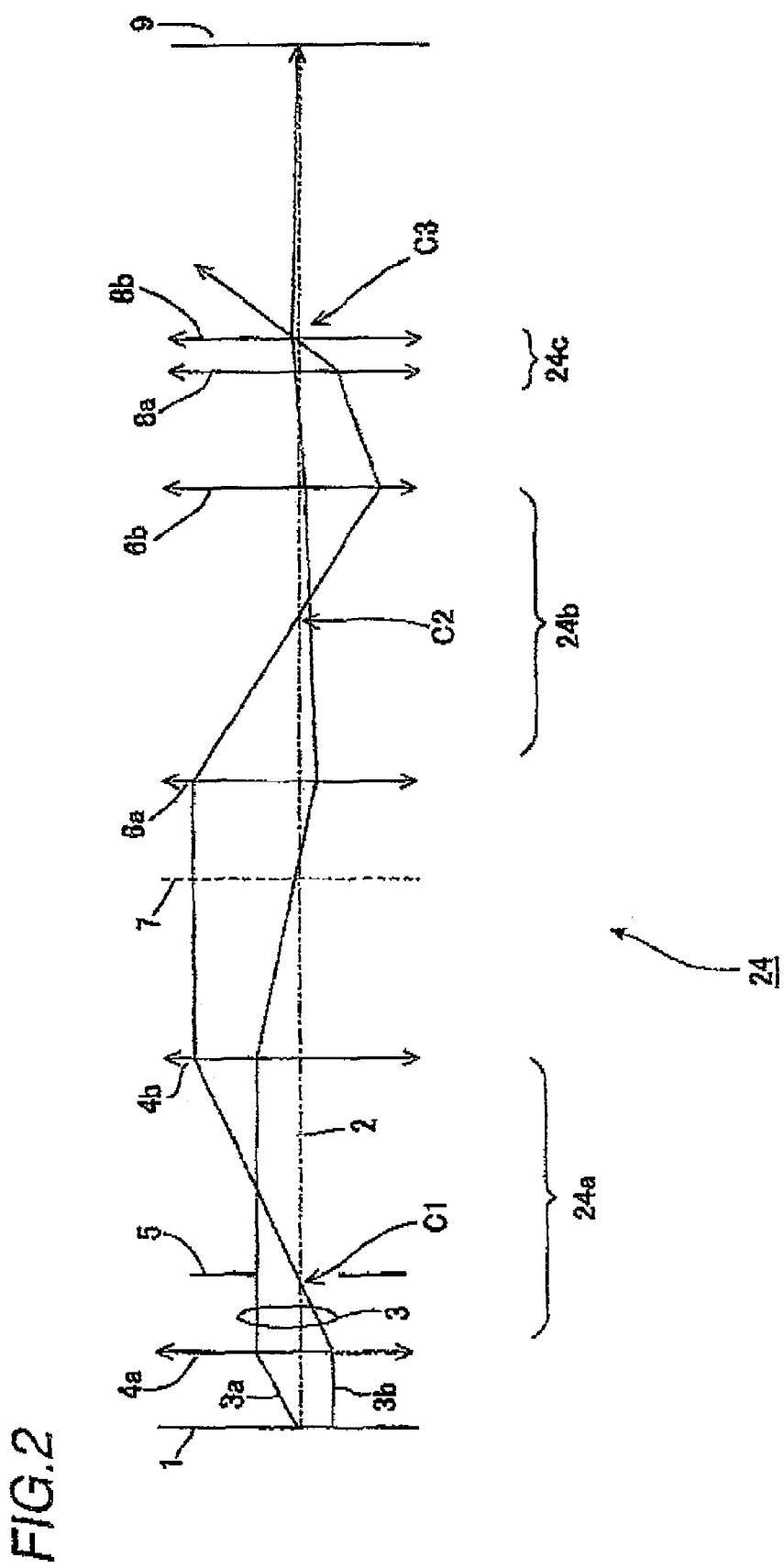
FIG. 2 is a diagram generally illustrating the configuration of a projection/image formation optical system in the projection electronic microscope illustrated in FIG. 5 and optical paths of electron beams.

Embodiments of projection electronic microscopes according to the present invention will be hereinafter described in detail with reference to FIGS. 3 to 6. In these figures, the general configuration of the projection electronic microscope is similar to the conventional one illustrated in FIG. 1. Accordingly, the irradiation electro-optical system 22 from the electron gun 21 to the beam separator 23 is the same as the conventional one, so that the following description will be centered on the projection/image formation electro-optical system 24. In FIGS. 1 to 6, the same reference numerals and reference symbols designate the same components.

Figure 3:
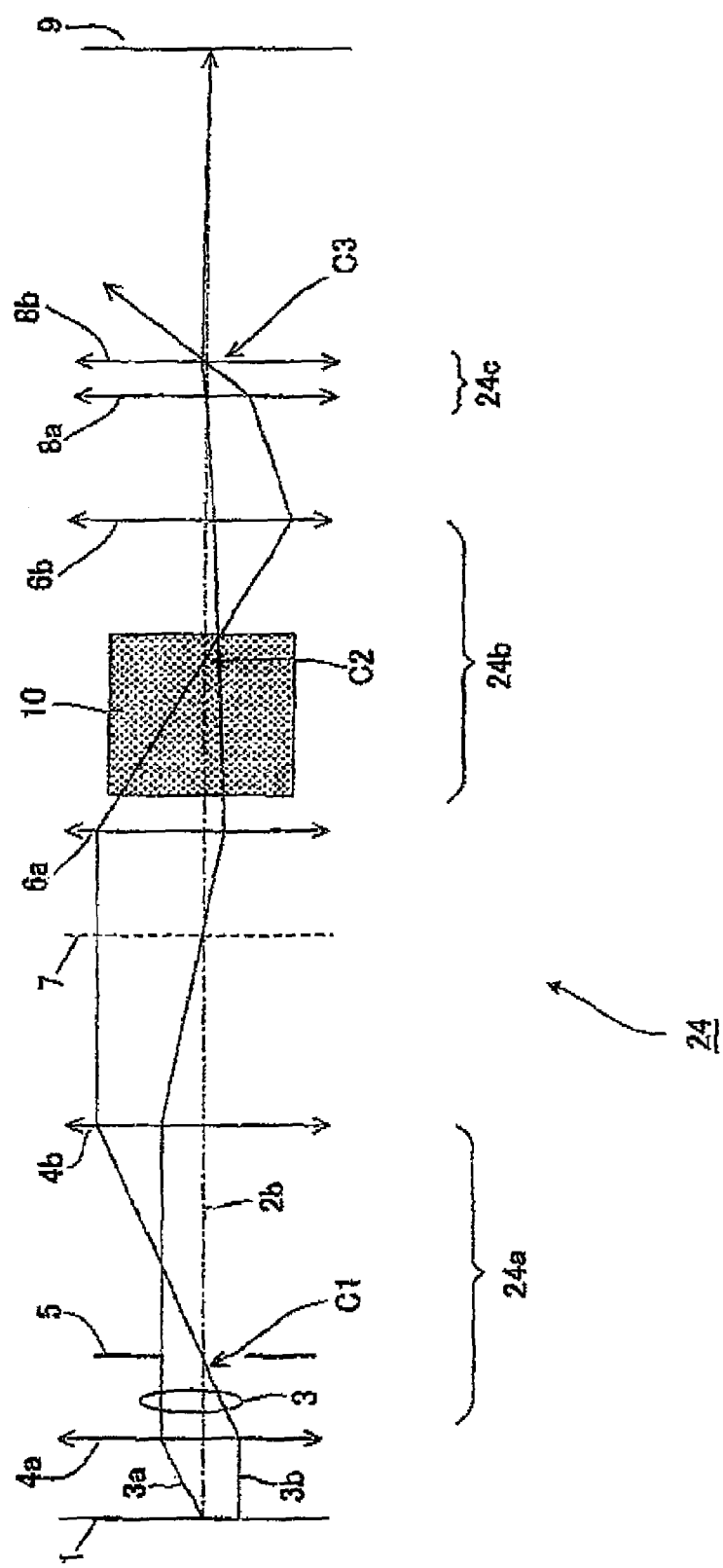
FIG. 3 is a diagram generally illustrating the configuration of a projection/image formation optical system and optical paths of a highly magnified image formation in a first embodiment of a projection electronic microscope according to the present invention.
Figures 4A, 4B:
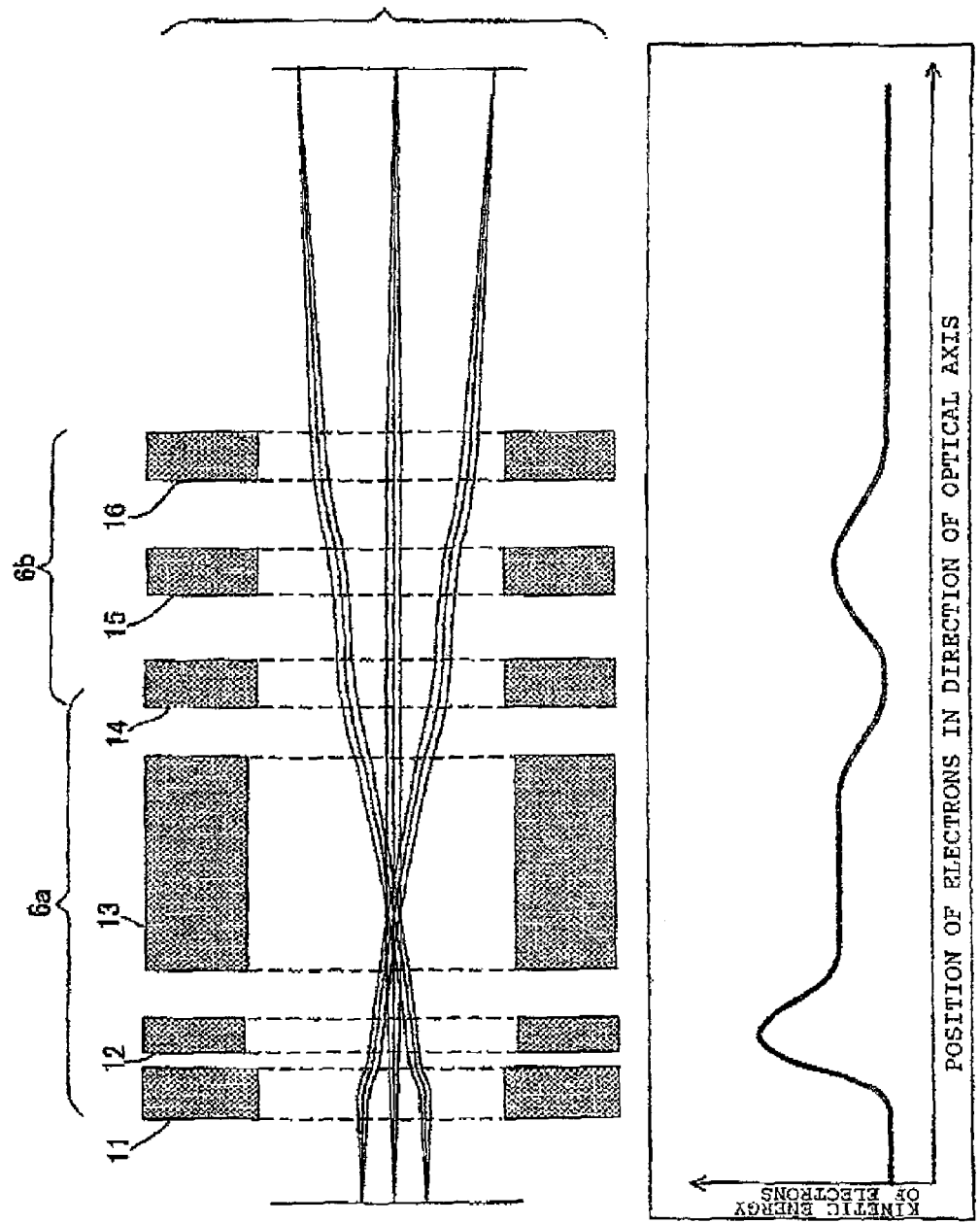
FIG. 4A is a diagram illustrating the configuration of electrodes in two zoom lenses of a transfer lens system shown in FIG. 3 and trajectories of electrons in a highly magnified image formation.
FIG. 4B is a diagram showing a kinetic energy distribution of electrons in FIG. 2A.
Figure 5:
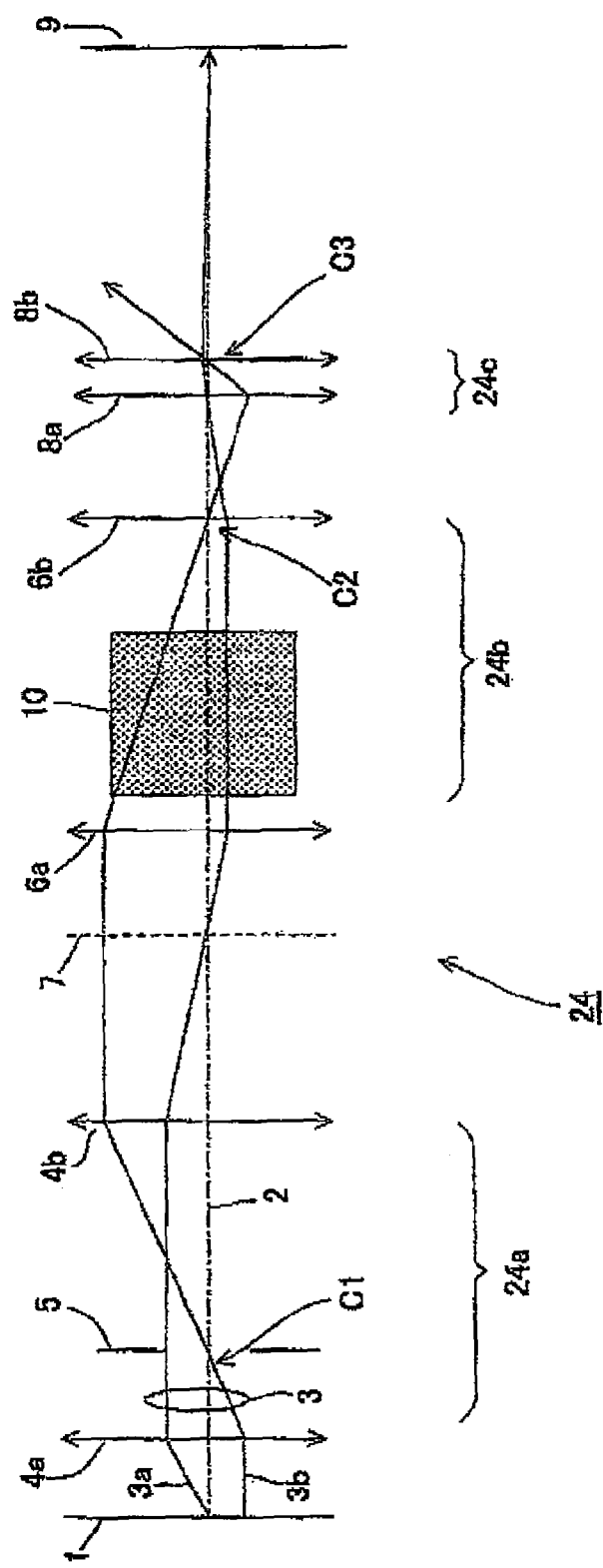
FIG. 5 is a diagram generally illustrating the configuration of a projection/image formation optical system and optical paths of a lowly magnified image formation in a second embodiment of a projection electronic microscope according to the present invention.

FIG. 3 is a diagram generally illustrating the configuration of the projection/image formation optical system 25 and light paths of secondary electron beams in a first embodiment of the projection electronic microscope according to the present invention, and FIG. 5 is a diagram generally illustrating the configuration of the projection/image formation optical system 25 and light paths of secondary electron beams in a second embodiment of the projection electronic microscope according to the present invention. In these embodiments, the projection/image formation optical system 24 is a zoom type optical system which comprises an objective lens system 24a, a zoom type transfer lens system 24b, and projection lens system 24c arranged along a linear optical axis 26. The transfer lens system 24b comprises a first zoom lens 6a and a second zoom lens 6b, where Einzel lenses may be used for these zoom lenses 6a, 6b, by way of example. The first zoom lens 6a is composed of a plurality of electrodes, where a thicker electrode is disposed behind a focusing electrode within the plurality of electrodes, and is applied with a positive voltage to form an equi-potential distribution space 10 which has a zero field strength and a high positive potential in a region sandwiched between the two zoom lenses 6a, 6b. As this electrode (electrode 13 in FIG. 4A) is increased in thickness, the space 10 becomes longer along the optical axis.

In the first embodiment illustrated in FIG. 3, the transfer lens system 24b is at a magnification which results in a highly magnified image formation. Thus, a peripheral electron beam 3a emitted from an axial point on a sample surface 1 with the irradiation of a primary electron beam is collimated by the first objective lens 4a to be in parallel with the optical axis 26, and is caused to intersect with the optical axis 26 on a center plane 7 of the beam separator 23 by the second objective lens 4b. Subsequently, the peripheral electron beam 3a passes through the center plane 7 of the beam separator 23, is incident on and strongly converged by the first zoom lens 6a of the transfer lens system 24b, and is caused to intersect with the optical axis 26 at the position of a second main surface of the first projection lens 8a by the second zoom lens 6b. The peripheral electron beam 3a which exits the first projection lens 8a is further caused to intersect with the optical axis 26 on the detection plane 9 of the detection system 25 by the second projection lens 8b.

On the other hand, a main electron beam 3b emitted in parallel from an off-axis point on the sample surface 1 is converged by the first objective lens 4a, and intersects with the optical axis at the center point of the diaphragm 5. This point defines a first cross-over C1. Subsequently, the main electron beam 3b is collimated by the second objective lens 4b to be in parallel with the optical axis 26, passes through the center plane 7 of the beam separator 23, and is incident on the first zoom lens 6a. In the highly magnified image formation shown in FIG. 3, the main electron beam 3b is caused to intersect with the optical axis 26 within a space 10 by the first zoom lens 6a. This point defines a second cross-over C2. Subsequently, the main electron beam 3b is converged by the second zoom lens 6b to some degree, is incident on and further converged by the first projection lens 8a, and intersects with the optical axis 26 near the center point of the projection lens 8b. This point defines a third cross-over C3.

FIG. 4A illustrates the configuration of the two zoom lenses in the transfer lens system 24b, and the trajectory of electrons in the case of the highly magnified image formation described above, and FIG. 2B shows a kinetic energy distribution associated therewith. FIG. 4A is a cross-sectional view taken along a plane including the optical axis in FIG. 3, and as illustrated, the first zoom lens 6a is composed of two ground electrodes 11, 14, a voltage applied electrode 12 for focusing; and a voltage applied electrode 13 for increasing the kinetic energy of electrons at the second cross-over C2, while the second zoom lens 6b is composed of two ground electrodes 14, 16; and a voltage applied electrode 15 for focusing. These electrodes 11-16 are all in the shape of a cylinder centered at the optical axis 26, and the first zoom lens 6a and second zoom lens 6b share the ground electrodes to constitute an optical cemented doublet.

In this way, in the first embodiment, the second cross-over C2 is defined within the equi-potential distribution space 10, so that the kinetic energy of electrons is increased in a region near the second cross-over C2, allowing the main electron beam 3b to rapidly pass through the equi-potential distribution space 10, which has zero field strength and a high positive potential, while maintaining a high electron density, thus making it possible to reduce an electron interaction time and debilitate the space charge effect.

Next, in the second embodiment illustrated in FIG. 5, the transfer lens system 24b is in a low magnification state which results in a lowly magnified image. Again, the peripheral electron beam 3a is collimated by the first objective lens 4a to be in parallel with the optical axis 26, and is caused to intersect with the optical axis 26 on the center plane 7 of the beam separator 23 by the second objective lens 4b. Subsequently, the peripheral electron beam 3a passes through the center plane 7 of the beam separator 23, is incident on and strongly converged by the first zoom lens 6a of the transfer lens system 24b, and is further strongly converged by the second zoom lens 6b to intersect with the optical axis 26 at the position of the second main surface of the first projection lens 8a. Subsequently, the peripheral electron beam 3a is caused to intersect with the optical axis 26 on the detection plane 9 of the detection system 25 by the second projection lens 8b.

The main electron beam 3b in turn is converged by the first objective lens 4a, and intersects with the optical axis 26 at the center point of the diaphragm 5. This point defines the first cross-over C1. Subsequently, the main electron beam 3b is collimated by the second objective lens 4b to be in parallel with the optical axis 26, passes through the center plane 7 of the beam separator 23, and is incident on the first zoom lens 6a. In the case of the lowly magnified image formation illustrated in FIG. 3, the main electron beam 3b is incident on the second zoom lens 6b toward a second main point thereof by the action of the first zoom lens 6a and equi-potential distribution space 10, and intersects with the optical axis 26 near the center point of the second zoom lens 6b. This point defines the second cross-over C2. Subsequently, the main electron beam 3b, which has passed through the second zoom lens 6b, is incident on and further converged by the first projection lens 8a, and intersects with the optical axis 26 near the center point of the second projection lens 8b. This point defines the third cross-over C3.

FIG. 6A illustrates the trajectory of electrons in the transfer lens system 24b in the case of the lowly magnified image formation described above, and FIG. 6B shows a kinetic energy distribution of electrons associated therewith. Since the configuration of the transfer lens system 24b is the same as that described in connection with FIG. 4A, a description thereon is omitted herein. As has been previously described in connection with FIG. 5, in the second embodiment, when the transfer lens system 24b has a very large zooming range, for example, from one to five times, the cross-over of the lowly magnified image formation by the first zoom lens 6a of the transfer lens system 24b is defined on the second main surface of the second zoom lens 6b.

In a lowly magnified image formation, aberration in image formation is mainly generated by the second zoom lens 6b. The geometric aberration of a lens relates to the height and slope of incident electrons, and the geometric aberration increases as they are made larger and larger. As such, since the main electron beam 3b is incident on the second zoom lens 6b of the transfer lens system 24b toward the second main point thereof in the lowly magnified image formation, the main electron beam 3b is incident at substantially zero height with a small slope. In this way, in the lowly magnified image formation which involves a wider diverging angle and a larger viewing field size than the highly magnified image formation, the main electron beam 3b emitted from an off-axis point is incident on the second zoom lens 6b with a small height and slope, thus making it possible to largely reduce the geometric aberration.

Further, with the transfer lens system 24b having a very large zooming range, when a positive voltage is applied to the center electrode of a plurality of electrodes which make up the second zoom lens 6b, the kinetic energy of the electron beams is increased near the second cross-over C2 because the second cross-over C3 is positioned near the center point of the center electrode of this lens in the lowly magnified image formation, causing the electron beams to pass through the second cross-over C2 at higher speeds. This can result in a shorter electron interaction time and a lower space charge effect.

The degree to which the space charge effect is reduced mainly depends on the length of a space in which the kinetic energy of electron beams is increased and a kinetic energy increasing rate. Thus, when a simulation was made in the projection/image formation optical system 24 illustrated in FIG. 3 with the length of the space chosen to be 15 mm and the electron beam kinetic energy increasing rate chosen to be two, it was confirmed that a reduction of 10% or more could be achieved.

As will be understood from the detailed description of the present invention in connection with the embodiments, the electron interacting time can be reduced to debilitate the space charge effect and largely reduce the geometric aberration by incorporating a contrivance into the configuration of the transfer lens system in the projection/image formation optical system.

What is claimed is:

1. A projection electronic microscope comprising:
an irradiation system for emitting a primary electron beam irradiated to a sample; and
a projection/image formation optical system for guiding a second electron beams emitted from the sample with the irradiation of the primary electron beam to a detection system, said projection/image formation optical system including a zoom type transfer lens system having a first zoom lens and a second zoom lens, said first zoom lens including a plurality of electrodes,
wherein a predetermined electrode of said plurality of electrodes is made thicker and is applied with a positive voltage to form a space having zero field strength and a high positive potential between said first zoom lens and said second zoom lens, and a cross-over by said first zoom lens is defined in said space within a zooming range, and
said first zoom lens is positioned closer to the sample than said second zoom lens.

2. A projection electronic microscope comprising:
an irradiation system for emitting a primary electron beam irradiated to a sample; and
a projection/image formation optical system for guiding a second electron beams emitted from the sample with the irradiation of the primary electron beam to a detection system, said projection/image formation optical system including a zoom type transfer lens system having a first zoom lens and a second zoom lens, said first zoom lens including a plurality of electrodes,
wherein a predetermined electrode of said plurality of electrodes is made thicker and is applied with a positive voltage to form a space having zero field strength and a high positive potential between said first zoom lens and said second zoom lens,
a cross-over of lowly magnified image formation by said first zoom lens is defined on a second main surface of said second zoom lens in accordance with a zooming range of said projection/image formation optical system, and
said first zoom lens is positioned closer to the sample than said second zoom lens.

3. A projection electronic microscope comprising:
an irradiation system for emitting a primary electron beam irradiated to a sample; and
a projection/image formation optical system for guiding a second electron beams emitted from the sample with the irradiation of the primary electron beam to a detection system, said projection/image formation optical system including a zoom type transfer lens system having a first zoom lens and a second zoom lens, said first zoom lens including a plurality of electrodes,
wherein a predetermined electrode of said plurality of electrodes is made thicker and is applied with a positive voltage to form a space having zero field strength and a high positive potential between said first zoom lens and said second zoom lens,
a cross-over of lowly magnified image formation by said first zoom lens is defined on a second main surface of said second zoom lens in accordance with a zooming range of said projection/image formation optical system, and a positive voltage is applied to a predetermined electrode of said second zoom lens, and
said first zoom lens is positioned closer to the sample than said second zoom lens.

4. A projection electronic microscope according to any of claims 1 to 3, wherein said first zoom lens and said second zoom lens include einzel lenses.

* * * * *